(12) United States Patent
Ishihara et al.

(10) Patent No.: US 10,302,375 B2
(45) Date of Patent: May 28, 2019

(54) ALUMINUM-DIAMOND COMPOSITE, AND HEAT DISSIPATING COMPONENT USING SAME

(71) Applicant: DENKA COMPANY LIMITED, Tokyo (JP)

(72) Inventors: Yosuke Ishihara, Omuta (JP); Takeshi Miyakawa, Omuta (JP); Hideo Tsukamoto, Omuta (JP); Shinya Narita, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 224 days.

(21) Appl. No.: 15/305,262

(22) PCT Filed: Apr. 23, 2015

(86) PCT No.: PCT/JP2015/062344
§ 371 (c)(1),
(2) Date: Oct. 19, 2016

(87) PCT Pub. No.: WO2015/163395
PCT Pub. Date: Oct. 29, 2015

(65) Prior Publication Data
US 2017/0045314 A1    Feb. 16, 2017

(30) Foreign Application Priority Data

Apr. 25, 2014   (JP) ................................ 2014-091304

(51) Int. Cl.
*B22F 3/00*    (2006.01)
*F28F 13/18*   (2006.01)
(Continued)

(52) U.S. Cl.
CPC .............. *F28F 13/18* (2013.01); *C01B 32/28* (2017.08); *C22C 1/05* (2013.01); *C22C 1/10* (2013.01);
(Continued)

(58) Field of Classification Search
None
See application file for complete search history.

(56) References Cited

U.S. PATENT DOCUMENTS 5,523,049 A * 6/1996 Terpstra ................. B22F 3/1021
257/E23.112
7,173,334 B2 * 2/2007 Sung ......................... B22F 3/10
257/720

(Continued)

FOREIGN PATENT DOCUMENTS

EP  2 305 400 A1   4/2011
JP  H09-157773 A   6/1997
(Continued)

OTHER PUBLICATIONS

Aug. 4, 2015 International Search Report issued in International Patent Application No. PCT/JP2015/062344.
(Continued)

*Primary Examiner* — Seth Dumbris
(74) *Attorney, Agent, or Firm* — Oliff PLC

(57) ABSTRACT

An aluminum-diamond composite that exhibits both high thermal conductivity and a coefficient of thermal expansion close to that of semiconductor devices, and that can suppress the occurrence of swelling, etc., of a surface metal layer portion even in actual use under a high load. An aluminum-diamond composite includes 65-80 vol % of a diamond powder having a roundness of at least 0.94, for which a first peak in a volumetric distribution of grain size lies at 5-25 µm, and a second peak lies at 55-195 µm, and a ratio between the area of the volumetric distribution of grain sizes of 1-35 µm and the area of the volumetric distribution of grain sizes of 45-205 µm is from 1:9 to 4:6; the balance being composed of a metal containing aluminum.

5 Claims, 1 Drawing Sheet

(51) Int. Cl.
  *C22C 1/05* (2006.01)
  *C22C 1/10* (2006.01)
  *C22C 26/00* (2006.01)
  *H01L 23/373* (2006.01)
  *F28F 21/08* (2006.01)
  *C01B 32/28* (2017.01)

(52) U.S. Cl.
  CPC ............ *C22C 26/00* (2013.01); *F28F 21/084* (2013.01); *F28F 21/089* (2013.01); *H01L 23/373* (2013.01); *H01L 23/3732* (2013.01); *C22C 2026/008* (2013.01); *F28F 2255/06* (2013.01); *H01L 2924/0002* (2013.01); *Y10T 428/12056* (2015.01); *Y10T 428/12063* (2015.01); *Y10T 428/12069* (2015.01); *Y10T 428/12076* (2015.01); *Y10T 428/12083* (2015.01); *Y10T 428/12889* (2015.01); *Y10T 428/12944* (2015.01)

(56) References Cited

U.S. PATENT DOCUMENTS

| | | |
|---|---|---|
| 2005/0074355 A1 | 4/2005 | Pickard et al. |
| 2011/0198771 A1 | 8/2011 | Hirotsuru et al. |
| 2014/0148082 A1* | 5/2014 | Dumm .................. C01B 25/165 451/28 |
| 2014/0182824 A1 | 7/2014 | Hirotsuru et al. |
| 2017/0268834 A1* | 9/2017 | Ishihara .................. C22C 26/00 |

FOREIGN PATENT DOCUMENTS

| | | |
|---|---|---|
| JP | 2000-303126 A | 10/2000 |
| JP | 2002-3831 A | 1/2002 |
| JP | 2007-518875 A | 7/2007 |
| JP | 2007-247058 A | 9/2007 |
| JP | 2012-117085 A | 6/2012 |
| JP | 2012-158817 A | 8/2012 |
| WO | 2010/007974 A1 | 1/2010 |
| WO | 2010/027504 A1 | 3/2010 |
| WO | 2013/015158 A1 | 1/2013 |

OTHER PUBLICATIONS

Sep. 11, 2017 Extended Search Report issued in European Patent Application No. 15782584.5.

* cited by examiner

ND HEAT DISSIPATING COMPONENT USING
ALUMINUM-DIAMOND COMPOSITE, AND HEAT DISSIPATING COMPONENT USING SAME

TECHNICAL FIELD

The present invention relates to an aluminum-diamond composite and a heat-dissipating component using the same.

BACKGROUND ART

Generally, in semiconductor devices such as the semiconductor laser devices and RF devices that are used in optical communications and the like, the problem of how to efficiently remove the heat generated by the devices is very important in order to prevent malfunctions or the like. In recent years, advances in semiconductor device technologies have led to higher outputs, higher speeds and higher integration of devices, placing ever stricter demands on their heat dissipation. For this reason, higher thermal conductivity is also generally required in heat-dissipating components such as heat sinks, and copper (Cu), which has a high thermal conductivity of 390 W/mK, is used.

On the other hand, individual semiconductor devices are becoming larger in size with the increased outputs, and the problem of mismatches in the thermal expansion between semiconductor devices and the heat sinks used for heat dissipation has gained prominence. In order to solve this problem, the development of a heat sink material that has the property of high thermal conductivity while also having a coefficient of thermal expansion that matches with that of semiconductor devices has been sought. As such materials, composites of metals and ceramics, for example, composites of aluminum (Al) and silicon carbide (SiC), have been proposed (Patent Document 1).

However, the thermal conductivity of an Al—SiC composite cannot be lowered to 300 W/mK or less no matter how the conditions are optimized, so the development of a heat sink material having even higher thermal conductivity, greater than the thermal conductivity of copper, has been sought. As such a material, a metal-diamond composite that combines the high thermal conductivity possessed by diamonds with the high coefficient of thermal expansion possessed by metals, and thus has high thermal conductivity and a coefficient of thermal expansion close to that of semiconductor device materials, has been proposed (Patent Document 2).

Additionally, in Patent Document 3, a β-type SiC layer is formed on the surfaces of diamond grains, thereby suppressing the generation of metal carbides having low thermal conductivity that are formed at the time of compositing, and improving the wettability with molten metals, thereby improving the thermal conductivity of the resulting metal-diamond composite.

Furthermore, since diamond is an extremely hard material, metal-diamond composites that are obtained by compositing diamond with metals are similarly very hard, difficult-to-work materials. For this reason, metal-diamond composites are mostly unworkable using normal diamond machine tools, and when using metal-diamond composites as heat sinks, which are small and have a variety of shapes, the issue of how to machine them at a low cost arises. In response to this issue, machining methods such as laser machining, waterjet machining, and furthermore, since metal-ceramic composites conduct electricity, electrical discharge machining, have been considered.

In heat-dissipating components for use in semiconductor devices, a metal layer must be added to the surface of the heat-dissipating component by plating or the like, in order to join them with devices. In the case of normal semiconductor devices, joining is mainly achieved by soldering, and since the joining temperature is 300° C. or less, a metal layer is provided on the surface by plating with an Ni—P alloy or the like.

However, in the mode of use as a heat sink material, in order to efficiently dissipate heat generated by a semiconductor device, the heat sink is usually arranged to be in contact with the semiconductor device by being joined by a brazing material or the like. For this reason, a multi-layer plating or the like, having gold plating applied to the joining surface, is used. Furthermore, in this type of application, as the joining temperature rises and the temperature load at the time of actual use increases, conventional alloy plating such as that using Ni—P alloys has the problem that swelling may occur due to the thermal expansion of the heat sink material and the plated film.

Furthermore, when a heat sink is joined to a semiconductor device by a brazing material or the like, the surface precision of the joint interface affects the heat-dissipating ability, and is therefore important. In the case of a conventional metal-diamond composite, diamond grains are exposed on the joint surface, so the surface roughness of the joint surface is high, and as a result, the thermal resistance of the contact interface unfavorably increases. For this reason, as a property sought in heat sink materials, there is the issue of how to lower the surface roughness of the surface.

Additionally, it is necessary to efficiently dissipate generated heat in order to raise the performance of semiconductor devices, and further high thermal conductivity materials are sought as heat sink materials.

Patent Document 1: JP H9-157773 A
Patent Document 2: JP 2000-303126 A
Patent Document 3: JP 2007-518875 A

SUMMARY OF THE INVENTION

The purpose of the present invention is to provide an aluminum-diamond composite that has both high thermal conductivity and a coefficient of thermal expansion close to that of semiconductor devices, and that can suppress the occurrence of swelling, etc., of a surface metal layer portion even in actual use under a high load.

The aluminum-diamond composite according to the present invention comprises 65-80 vol % of a diamond powder having a roundness of at least 0.94, for which a first peak in a volumetric distribution of grain size lies at 5-25 µm, and a second peak lies at 55-195 lam, and a ratio between the area of a volumetric distribution of grain sizes of 1-35 µm and the area of a volumetric distribution of grain sizes of 45-205 µm is from 1:9 to 4:6; the balance being composed of a metal containing aluminum.

According to one embodiment of the present invention, the aluminum-diamond composite uses a diamond powder that has been heat-treated, in an air atmosphere, at a temperature of at least 600° C. and at most 900° C., for at least 30 minutes and at most 180 minutes.

A heat-dissipating component according to the present invention is a heat-dissipating component consisting of the above-mentioned aluminum-diamond composite formed in the shape of a flat plate, wherein both surfaces of the aluminum-diamond composite are covered with a surface layer comprising at least 80 vol % of a metal containing aluminum and having a film thickness of 0.03-0.2 mm.

Additionally, according to one embodiment of the present invention, in the above-described heat-dissipating component, both surfaces have, in sequence from the aluminum-diamond composite-side, an Ni layer having a film thickness of 0.5-6.5 μm, an amorphous Ni alloy layer having a film thickness of 0.5-6.5 μm, and a metal layer consisting of an Au layer having a film thickness of at least 0.05 μm, such that the sum of the film thicknesses of the Ni layer and the Ni alloy layer is 1.0-10 μm.

Additionally, according to one embodiment of the present invention, in the above-described heat-dissipating component, the aluminum-diamond composite has a thickness of 0.4-6 mm.

The aluminum-diamond composite according to the present invention has a high thermal conductivity and a coefficient of thermal expansion close to that of semiconductor devices, and is capable of suppressing the swelling of surface metal layer portions or the like, even during actual use under a high load.

MODES FOR CARRYING OUT THE INVENTION

Explanation of Terminology

In the present specification, the symbol "-" refers to "equal to or greater than" and "equal to or less than". For example, "A-B" refers to the range of values that are equal to or greater than A and equal to or less than B.

In the present specification, "both surfaces" refers to both the front and rear surfaces of a flat plate-shaped element. Additionally, in the present specification, "side surface portions" refers to portions of a flat plate-shaped element that are approximately perpendicular to both surfaces and are provided about the periphery of both surfaces. Additionally, in the present specification, "hole portion" refers to a through-hole that is machined so as to penetrate through the top and bottom surfaces of a flat plate-shaped aluminum-diamond composite, provided in order to screw the component of the present invention to another heat-dissipating member.

Herebelow, an embodiment of an aluminum-diamond composite and a heat-dissipating component using the same according to the present invention, and the production method thereof, will be explained with reference to FIGS. 1 and 2.

Figure 1:
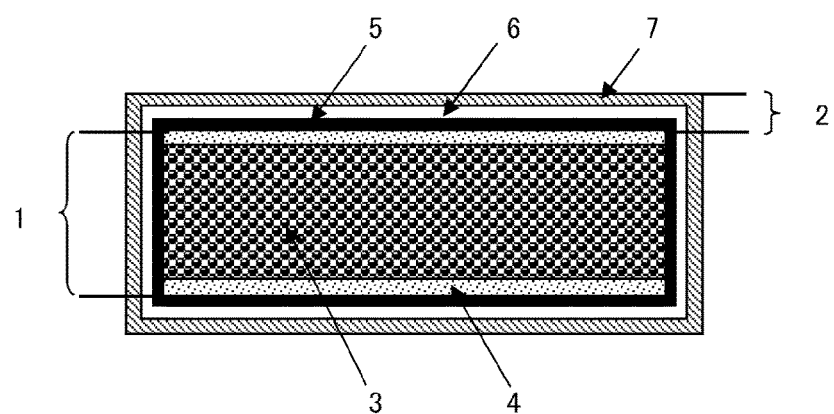
FIG. 1 A schematic structural diagram of an aluminum-diamond composite heat-dissipating component according to an embodiment of the present invention.

The heat-dissipating component according to the present embodiment is composed of an aluminum-diamond composite (reference number 1 in FIG. 1) and a surface metal layer (reference number 2 in FIG. 1). Additionally, the aluminum-diamond composite used in the heat-dissipating component is a flat plate-shaped aluminum-diamond composite comprising diamond grains and a metal containing aluminum, the aluminum-diamond composite 1 consists of a composited portion (reference number 3 in FIG. 1) and surface layers provided on both surfaces of the composited portion 3 (reference number 4 in FIG. 1), the surface layer 4 consists of a material comprising a metal containing aluminum, and the diamond grain content is 65-80 vol % of the entire aluminum-diamond composite 1.

The aluminum-diamond composite heat-dissipating component composed of the above-described configuration has a high thermal conductivity and a coefficient of thermal expansion close to that of semiconductor devices, and is capable of suppressing the occurrence of swelling or the like of the surface metal layer portion, even in actual use under a high load. For this reason, the aluminum-diamond composite according to the present embodiment is preferably used as a heat-dissipating component such as a heat sink for dissipating heat from semiconductor devices or the like.

The heat-dissipating component according to the present embodiment may be further provided with a surface metal layer 2 consisting of an Ni layer (reference number 5 in FIG. 1), an amorphous Ni alloy layer (reference number 6 in FIG. 1) and an Au layer (reference number 7 in FIG. 1).

Herebelow, a method of production of the aluminum-diamond composite according to the present embodiment by a liquid-metal forging method will be described.

The methods for producing the aluminum-diamond composite can be largely divided between impregnation and powder metallurgy. Of these, impregnation is more often used in the products that have actually been commercialized, in view of properties such as thermal conductivity. There are also various methods of impregnation, including methods performed at standard pressure, and high-pressure forging which is performed under high pressure. High-pressure forging includes liquid-metal forging and die casting.

The preferred method in the present embodiment is high-pressure forging wherein impregnation is performed at a high pressure, and liquid-metal forging is preferable in order to obtain a dense composite having excellent properties such as thermal conductivity. Liquid-metal forging generally involves filling a high-pressure container with a powder or molded compact of diamond or the like, and impregnating the same with a molten aluminum alloy or the like at a high temperature and a high pressure to obtain the composite material.

[Diamond Powder]

As the diamond powder which is a raw material of the aluminum-diamond composite, either a natural diamond powder or a synthetic diamond powder may be used. Additionally, a binder such as silica, for example, may be added to the diamond powder as needed. By adding a binder, it is possible to obtain the effect of being able to form a molded compact.

Regarding the grain size of the diamond powder, in view of the thermal conductivity, there is preferably a first peak in the volumetric distribution of the grain size at 5-25 μm, and a second peak at 55-195 μm, and the ratio between the area of the volumetric distribution of grain sizes of 1-35 μm and the area of the volumetric distribution of grain sizes of 45-205 μm is preferably from 1:9 to 4:6.

The distribution of the grain size should more preferably be such that the grain size at the first peak is 10-20 μm and the grain size at the second peak is 100-180 μm. Additionally, while the above-indicated ratios are preferable in order to raise the diamond filling rate, the ratio is even more preferably 2:8 to 3:7. The grain size distribution measurements are performed using a method that is generally used, such as an image analysis method, the Coulter method, or a laser diffraction-scattering method.

The shape of the diamond grains should preferably have a roundness of at least 0.94, and more preferably at least 0.96 in view of improving the diamond filling rate. If the roundness is at least 0.94, then the diamond grains will be adequately filled, and the desired thermal conductivity can be obtained. While there is no upper limit on the roundness, the cost can become high, so the roundness must be set in accordance with the desired properties and the cost. The roundness was obtained by observing at least 100 grain images at 5-times magnification or more, calculating the value by image analysis, and taking the average value as the roundness.

There is a possibility that the thermal conductivity of the diamond grains having a roundness of at least 0.94 can be reduced by thermal cycling due to reduced adhesion with the aluminum. For this reason, a heat treatment should preferably be performed, in an air atmosphere, at a temperature of at least 600° C. and at most 900° C., for at least 30 minutes and at most 180 minutes. By carrying out such a heat treatment, the grain surface should be roughened to such a degree that roundness does not become less than 0.94. The conditions of the heat treatment are more preferably 700-800° C. for 60-90 minutes.

Sufficient roughening can be achieved at 600° C. or greater, and decreases in the properties due to oxidation of the diamond can be suppressed at 900° C. or lower. The level of roughening is sufficient if the treatment time is at least 30 minutes, and reductions in the properties due to oxidation of the diamond can be suppressed if the treatment time is 180 minutes or less.

The method for roughening the diamond grain surface may be any method that does not affect the properties of the diamond grains, such as methods of immersion in a salt bath or aqua regia, but the above-mentioned heat treatment is suitable for carrying out the roughening treatment while maintaining roundness.

The diamond grain content of the aluminum-diamond composite is preferably at least 65 vol % and at most 80 vol %. If the diamond grain content is at least 65 vol %, sufficient thermal conductivity can be ensured for the resulting aluminum-diamond composite. Additionally, the diamond grain content should preferably be 80 vol % or less in view of the filling rate. If the amount is 80 vol % or less, there is no need to work the diamond grains into a spherical shape or the like, and an aluminum-diamond composite can be obtained at a stable cost.

In composites obtained by liquid-metal forging, under appropriate conditions, molten metal will spread throughout the spaces between the powders, so the proportional volume of the powder with respect to the filled volume will be roughly the same as the volume of the powder material (grain content) with respect to the volume of the entire composite that is obtained.

Furthermore, by using a diamond powder wherein a β-type silicon carbide layer is formed on the surfaces of the diamond grains, it is possible to suppress the generation of low-thermal-conductivity metal carbides ($Al_4C_3$) that are formed during compositing, and to improve the wettability with molten aluminum. As a result, it is possible to obtain the effect of improving the thermal conductivity of the resulting aluminum-diamond composite.

Figure 2:
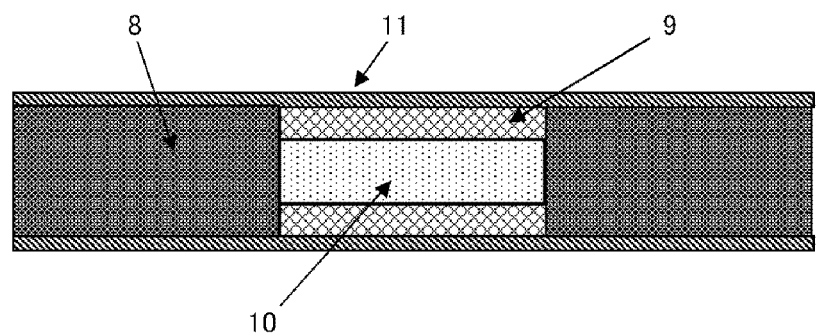
FIG. 2 A schematic section view of a structural laminate before compositing of an aluminum-diamond composite according to an embodiment of the present invention.

In preparation for liquid-metal forging, a mold member (reference number 8 in FIG. 2) consisting of a porous body that can be impregnated by an aluminum alloy, a dense mold release plate (reference number 9 in FIG. 2) coated with a mold release agent, and the above-mentioned diamond powder (reference number 10 in FIG. 2) are arranged as shown in FIG. 2, to form a structure for liquid-metal forging, consisting of a mold member 8, a mold release plate 9 and a filled diamond powder 10.

FIG. 2 is a section view of the structure for liquid-metal forging, the section being taken at a portion filled with the diamond powder. When compositing the aluminum alloy and the diamond powder by liquid-metal forging, the aluminum alloy reaches the portion filled with the diamond powder by passing through the mold member consisting of a porous body.

[Mold Member Consisting of Porous Body]

There are no particular constraints on the material of the mold member 8 consisting of a porous body that can be impregnated by the aluminum alloy during liquid-metal forging, as long as the porous material can be impregnated with an aluminum alloy by liquid-metal forging. However, the porous body is preferably a porous body of graphite, boron nitride, alumina fibers, or the like, having excellent heat resistance and capable of providing a stable supply of molten metal.

[Mold Release Plate]

Furthermore, as the dense mold release plate 9, a stainless steel plate or a ceramic plate may be used, and there are no particular limitations as long as it is a dense body that cannot be impregnated by the aluminum alloy during liquid-metal forging. Additionally, regarding the mold release agent that is coated onto the mold release plates, mold release agents having excellent heat resistance, such as graphite, boron nitride, and alumina, can be used. Furthermore, a mold release plate that can achieve more stable mold release may be obtained by applying the mold release agent after coating the surface of the mold release plate with an alumina sol or the like.

[Aluminum Alloy]

The aluminum alloy (metal containing aluminum) in the aluminum-diamond composite according to the present embodiment should preferably have a low melting point in order to be able to sufficiently penetrate into the spaces in the diamond powder (between the diamond grains) during impregnation. Examples of such aluminum alloys include, for example, aluminum alloys containing 5-25 mass % of silicon. By using an aluminum alloy containing 5-25 mass % of silicon, it is possible to obtain an effect of promoting densification of the aluminum-diamond composite.

Furthermore, including magnesium in the aluminum alloy causes the diamond grains and ceramic grains to more firmly bind to the metal portion, and is therefore preferred. Regarding the metal components in the aluminum alloy other than aluminum, silicon and magnesium, there are no particular limitations as long as it is within a range that does not significantly change the properties of the aluminum alloy. For example, copper or the like may be included.

The thickness of the aluminum-diamond composite according to the present embodiment can be adjusted by the filling rate of the diamond powder at the time of compositing, and the thickness is preferably 0.4-6 mm. If the thickness is less than 0.4 mm, then the strength is not adequate for use as a heat sink or the like. If the thickness exceeds 6 mm, the material itself becomes expensive, and the effects such as high thermal conductivity cannot be adequately obtained.

In the present embodiment, mold release plates 9 that are arranged on both surfaces are stripped away after compositing. Due to this special configuration, it is possible to obtain an aluminum-diamond composite having an extremely smooth surface.

As shown in FIG. 2, metal plates (reference number 11 in FIG. 2) may be arranged on both surfaces of the structure. Additionally, if a plurality of structures are to be stacked to form a block, they may be stacked by providing the metal plates 11 between the structures. By arranging the mold release plates in this way, the molten metal can be evenly impregnated, and operations such as removal of the aluminum-diamond composite after impregnation can be easily performed.

A plurality of the resulting structures is further stacked to form a block, and this block is heated at about 600-750° C. Additionally, one or more of the blocks are arranged inside a high-pressure container, and as quickly as possible in order to prevent the temperature of the blocks from dropping, a molten aluminum alloy heated to above the melting point is supplied and pressed at a pressure of at least 20 MPa.

If the block heating temperature is at least 600° C., the aluminum alloy compositing stabilizes, and an aluminum-diamond composite having sufficient thermal conductivity can be obtained. Additionally, if the heating temperature is 750° C. or less, the generation of aluminum carbide ($Al_4C_3$) on the diamond powder surface during compositing with the aluminum alloy can be suppressed, and an aluminum-diamond composite having adequate thermal conductivity can be obtained.

Additionally, regarding the pressure during impregnation, the compositing of the aluminum alloy can be made stable and an aluminum-diamond composite having adequate thermal conductivity can be obtained, as long as the pressure is at least 20 MPa. More preferably, the impregnation pressure is at least 50 MPa. If the pressure is at least 50 MPa, an aluminum-diamond composite having more stable thermal conductivity properties can be obtained.

[Anneal Treatment]

The aluminum-diamond molded compact obtained by the above-indicated operation can also be annealed. By performing an anneal treatment, strain in the aluminum-diamond molded compact can be eliminated, and an aluminum-diamond composite having more stable thermal conductivity properties can be obtained.

In order to remove only the strain inside the molded compact without affecting the surface of the resulting aluminum-diamond molded compact, the anneal treatment is preferably performed for at least 10 minutes at temperature conditions of 400-550° C.

Machining Method

Next, an example of a machining method for the aluminum-diamond composite according to the present embodiment will be explained. The aluminum-diamond composite is an extremely hard, difficult-to-work material. For this reason, the aluminum-diamond composite is difficult to normally machine or grind using diamond machine tools, so it is worked by waterjet machining, laser machining or electrical discharge machining.

The aluminum-diamond molded compact according to the present embodiment may also be worked using normal diamond machine tools or the like, but the material is extremely hard and difficult to work, so it should preferably be worked by waterjet machining, laser machining or electrical discharge machining, in view of the durability of the machine tools and the machining cost.

[Surface Layer]

The aluminum-diamond composite according to the present embodiment is characterized in that both surfaces of the composited portion (reference number 3 in FIG. 1) are covered by surface layers (reference number 4 in FIG. 1) consisting of a material comprising a metal (aluminum alloy) containing aluminum.

The above-mentioned surface layer 4 mainly consists of a material comprising a metal containing aluminum, but may also contain substances other than a metal containing aluminum. In other words, it may contain the above-mentioned diamond grains or other impurities.

However, the diamond grains preferably do not exist in a portion 0.01 mm from the surface of the surface layer 4. Due to such a configuration, the surface layer 4 can be made smooth, without causing polishing scratches, by using working methods that are normally used in metalworking.

Additionally, the surface layer 4 preferably comprises at least 80 vol % of a metal containing aluminum. If the amount of the metal containing aluminum is at least 80 vol %, the surface layer 4 can be polished using a working method that is normally used in metalworking. Furthermore, the amount of the metal containing aluminum is preferably at least 90 vol %. If the amount of the metal containing aluminum is at least 90 vol %, polishing scratches will not occur due to impurities within the interior coming free when polishing the surface.

Additionally, the thickness of the surface layer 4, by average thickness, is preferably at least 0.03 mm and at most 0.2 mm. If the average thickness of the surface layer 4 is at least 0.03 mm, the diamond grains will not be exposed during subsequent processing, and the targeted surface precision and plating performance can be easily obtained. Additionally, if the average thickness of the surface layer 4 is 0.2 mm or less, the portion of the resulting aluminum-diamond composite that is occupied by the composited portion 3 can be made sufficiently thick, and sufficient thermal conductivity can be ensured.

Additionally, the sum of the average thicknesses of the surface layers 4 on both surfaces is preferably 20% or less of the thickness of the aluminum-diamond composite 1, and more preferably 10% or less. If the sum of the average thicknesses of the surface layers 4 on both surfaces is 20% or less than the thickness of the aluminum-diamond composite 1, then adequate thermal conductivity can be obtained in addition to surface precision and plating performance.

The thickness of the surface layer 4 may be adjusted by compositing the aluminum alloy by arranging ceramic fibers such as alumina fibers between the diamond powder and the dense mold release plates coated with a mold release agent when filling the diamond powder. Additionally, the thickness can be adjusted by using aluminum foil instead of a ceramic fiber.

[Working of Surface Layer]

The aluminum-diamond composite according to the present embodiment has a structure wherein both surfaces are covered by surface layers 4 consisting of a material comprising a metal containing aluminum, so the surface precision (surface roughness: Ra) can be adjusted by working (polishing) these surface layers 4. These surface layers 4 may be worked by using a working method that is normally used in metalworking, and for example, they may be polished using a buffer polisher or the like, so as to make the surface roughness (Ra) 1 μm or less.

Furthermore, by working these surface layers 4, the average thicknesses of the surface layers can be adjusted. When the aluminum-diamond composite according to the present embodiment is to be used as a heat-dissipating component such as a heat sink, the surface should be smooth and have a low surface roughness when considering the thermal resistance on the joining surface, so the surface roughness (Ra) is preferably 1 μm or less, and more preferably 0.5 μm or less. By making the surface roughness 1 μm or less, the thickness of the joint layer can be made uniform, and a higher heat dissipation performance can be obtained.

Additionally, the planarity of the surface layers 4 should preferably be 30 μm or less, more preferably 10 μm or less, when converted to a size of 50 mm×50 mm. By setting the planarity to 1 μm or less, the thickness of the joint layer can be made uniform, and a higher heat dissipation performance can be obtained.

[Composited Portion]

The aluminum-diamond composite according to the present embodiment has a composited portion (reference number 3 of FIG. 1) which is a composite of the diamond grains and the aluminum alloy. With an aluminum-diamond composite having such a structure, stress does not easily arise between the surface layer 4 and the composited portion 3, and the surface layer 4 will not be damaged when a force is applied, such as by polishing or the like.

[Surface Metal Layer]

The aluminum-diamond composite according to the present embodiment, when used as a heat sink for a semiconductor device, will often be used by being joined to a semiconductor device by brazing. Therefore, a surface metal layer must be provided on the joining surface of the aluminum-diamond composite. The method of forming the surface metal layer may be plating, vapor deposition, sputtering, or the like. Plating is preferred in view of the processing cost.

Herebelow, the plating process will be explained.

First, the metal containing aluminum on the surface of the aluminum-diamond composite is plated with crystalline Ni to a film thickness of 0.5-6.5 μm. While the plating method is preferably an electroplating method, an electroless plating method may also be used as long as a crystalline Ni-plated film can be obtained. If the film thickness of the Ni plating is less than 1 μm, then pinholes (unplated portions) will be unfavorably formed on the plated film. If the film thickness exceeds 6.5 μm, the residual stress generated in the plated film increases, and in applications such as the present embodiment, the temperature load during actual use causes the plated film to swell and unfavorably results in problems such as peeling or cracking.

Furthermore, when Ni-plating aluminum, a pretreatment such as zinc substitution is necessary, and it is preferable to perform zinc substitution, which provides excellent plating adhesion. The adhesion of the Ni plating should preferably be such that the peel strength is at least 50 N/cm, and more preferably at least 78 N/cm. If the peel strength is less than 50 N/cm, when used as a heat-dissipating component for a semiconductor device, the temperature load at the time of actual use can cause the problem of peeling of the plating layer to occur.

Next, the surface of the Ni plating is plated with an Ni alloy to a film thickness of 0.5-6.5 μm by electroless plating. In this case, if electroplating is used, a plated film will not be formed over diamond grains that have been exposed on the side surface during working, thus unfavorably generating pinholes (unplated portions). In this case, the Ni alloy plating is generally plating of an alloy containing Ni and 5-15 wt % of phosphorous (P).

If the film thickness of the Ni alloy plating is less than 0.5 μm, then pinholes (unplated portions) can be unfavorably formed in the plated film. If the film thickness exceeds 6.5 μm, the residual stress generated in the plated film can increase, and in applications such as the present embodiment, the temperature load during actual use can cause problems such as swelling of the plated film and the generation of peeling and cracks. Additionally, as the joining temperature rises and the temperature load during actual use increases, there are problems in that the amorphous Ni alloy plating may crystallize, volume changes at that time can cause microcracks to form, and the cracks may expand with subsequent temperature loads, so the Ni alloy plating layer should preferably be made as thin as possible.

Furthermore, in applications of use as a heat-dissipating component in a high-output semiconductor device, as the joining temperature rises and the temperature load during actual use increases, there are problems in that swelling occurs due to differences in thermal expansion between the surface layer containing aluminum and the plated film. Additionally, the occurrence of swelling due to the temperature load during actual use can be suppressed by forming an Ni plating layer having a low hardness and having a difference in thermal expansion, with respect to the surface layer containing aluminum, that is smaller than that of the Ni alloy plating layer.

The sum of the thicknesses of the Ni plating layer and the Ni alloy plating layer is preferably thin, and should specifically be 1.0-10 μm. If the total thickness exceeds 10 μm, then swelling will occur during actual use, and if less than 1.0 μm, pinholes will be unfavorably formed.

Additionally, since the aluminum-diamond composite according to the present embodiment is worked by waterjet machining, laser machining or electrical discharge machining, the structure is such that diamonds are exposed on the side surfaces, so that if the Ni plating layer is formed by electroplating, the plated film will not be formed over the diamond grains on the side surfaces, resulting in the formation of pinholes. For this reason, the Ni alloy layer must be formed by electroless plating over the Ni plated surface.

Additionally, in applications for use as a heat-dissipating component in high-output semiconductor devices, as the joining temperature rises and the temperature load during actual use increases, there are problems in that the amorphous Ni alloy plating may crystallize, volume changes at that time can cause microcracks to form, and the cracks may expand with subsequent temperature loads. For this reason, the Ni alloy plating layer should preferably be made as thin as possible.

When performing brazing at a high temperature, it is preferable to plate the outermost surface with Au to a film thickness of 0.05-4 μm, by electroplating or electroless plating. If the plated film thickness is less than 0.05 μm, the joining will be unfavorably inadequate. Regarding the upper limit, there are no constraints in terms of the properties, but Au plating is extremely expensive, so the thickness should preferably be 4 μm or less.

Additionally, the aluminum-diamond composite according to the present embodiment should preferably have a thermal conductivity of at least 600 W/mK when the temperature of the aluminum-diamond composite is 25° C., and should preferably have a coefficient of thermal expansion, from 25° C. to 150° C., of $4\text{-}10 \times 10^{-6}$/K.

If the thermal conductivity is at least 600 W/mK at a temperature of 25° C., and the coefficient of thermal expansion, from 25° C. to 150° C., is $4\text{-}10 \times 10^{-6}$/K, a high thermal conductivity and a low coefficient of thermal expansion of about the same level as semiconductor devices is obtained. For this reason, when used as a heat-dissipating component such as a heat sink, excellent heat dissipation properties can be obtained, and even when subjected to temperature changes, damage to semiconductor devices can be suppressed because the difference in the coefficient of thermal expansion between semiconductor devices and the heat-dissipating component is small.

[Semiconductor Device]

The aluminum-diamond composite heat-dissipating component of the present embodiment has a high thermal conductivity and a low coefficient of thermal expansion of about the same level as semiconductor devices, and is suitable for use as a heat-dissipating component in semiconductor laser devices or RF devices requiring high outputs such as GaN, GaAs and SiC. In particular, the present embodiment is suitable for use as a heat-dissipating component in a GaN-HEMT device or a GaAs-HEMT device, these being RF devices.

The aluminum-diamond composite and heat-dissipating component using the same according to the present invention, and the production method thereof, have been explained by referring to an embodiment above, but the present invention is not to be construed as being limited thereto.

EXAMPLES

Herebelow, the present invention will be explained in further detail by giving examples and comparative examples, but the present invention is not to be construed as being limited thereto.

Examples 1-3 and Comparative Example 1

A high-purity diamond powder A having a volumetric distribution peak at 140 μm and a high-purity diamond powder B having a peak at 15 μm were mixed so that, in the volumetric distribution, the ratio of the area of the volumetric distribution from 1 to 35 μm to the area of the volumetric distribution from 45 to 205 μm was 7:3.

The grain size distribution was measured by adding the diamond powders to pure water to produce a slurry as the measurement solution, which was measured with a Beckman Coulter: Coulter L5230 using a refractive index of 1.33 for water and a refractive index of 2.42 for diamond. The average values of roundness measured at 5-times magnification for 200 grains are shown in Table 1 (Sysmex: Flow Particle Image Analyzer FPIA-3000).

Diamond powders were formed by mixing together respectively 35 g of diamond powder A, 15 g of diamond powder B, 16 g of silica powder (average grain size: 5 μm) and 16 g of silicon powder (average grain size: 10 μm), then loading the mixture into a silicon carbide crucible, and subjecting the mixture to a heat treatment for 3 hours at a temperature of 1450° C. in an argon atmosphere to form a layer of β-type silicon carbide on the diamond powder surface.

TABLE 1

|  | Roundness |
| --- | --- |
| Example 1 | 0.97 |
| Example 2 | 0.96 |
| Example 3 | 0.94 |
| Comparative Example 1 | 0.91 |

Next, a 40×40×2 mmt stainless steel plate (SUS 430 material) was coated with an alumina sol and baked for 30 minutes at 350° C., after which a graphite mold release agent was applied to the surface to produce a mold release plate (reference number 9 in FIG. 2). Additionally, the diamond powders of Table 1 were loaded so as to be sandwiched between the surfaces of mold release plates 9, with pure aluminum foil having a thickness of 30 μm being disposed above and below, inside an isotropic graphite tool (reference number 8 in FIG. 2) having a porosity of 20%, having a 40×40×8 mmt cavity in the center and external dimensions of 60×60×8 mmt, thereby forming a structure.

A plurality of the above-mentioned structures were stacked, interposed by 60×60×1 mmt stainless steel plates (reference number 11 in FIG. 2) coated with a graphite mold release agent, and iron plates having a thickness of 12 mm were arranged on both sides thereof, and connected by six M10 bolts that were tightened using a torque wrench with a planar-direction tightening torque of 10 Nm to form a single block.

Next, the resulting block was preheated to a temperature of 650° C. in an electric furnace, then placed in a press mold having an interior size of 300 mm which was heated beforehand, and a molten aluminum alloy, containing 12 mass % of silicon and 1 mass % of magnesium, at a temperature of 800° C., was poured in and pressed for 20 minutes at a pressure of 100 MPa to impregnate the diamond powder with the aluminum alloy. After cooling to room temperature, a wet handsaw was used to cut the block along the shape of the mold release plates, and the sandwiched stainless steel plates were stripped away. Thereafter, an annealing treatment was performed for 3 hours at a temperature of 530° C. in order to eliminate strain generated during impregnation, so as to obtain an aluminum-diamond composite.

The resulting aluminum-diamond composite was polished on both surfaces using #600 polishing paper, then buffed.

Next, the aluminum-diamond composite was worked to a shape of 25×25×2 mmt using a waterjet cutter (Sugino Machine Abrasive Jet Cutter NC), under conditions of a pressure of 250 MPa and a cutting speed of 50 mm/min, using garnets with a grain size of 100 μm as the abrasive grains.

Additionally, samples for measuring the coefficient of thermal expansion (3×2×10 mmt) and samples for measuring the thermal conductivity (25×25×2 mmt) were produced by waterjet machining. Using the respective sample pieces, the coefficient of thermal expansion for temperatures from 25° C. to 150° C. was measured using a thermal expansion meter (Seiko Electronics TMA300), and the thermal conductivity at 25° C. was measured by the laser flash method (Rigaku LF/TCM-8510B). Additionally, the results for the thermal conductivity after 1000 air-tank heat cycles from −50° C. (held for 30 minutes) to 135° C. (held for 30 minutes) are shown in Table 2.

Additionally, the densities of the resulting aluminum-diamond composites were measured by the Archimedean method and the Vf (diamond grain content) were calculated. The results are shown in Table 2. Vf was calculated by using the formula: (volume of diamond powder)/(fill volume: 40×40×2 mm=3.2 cm$^3$). Furthermore, for Example 1, a bending strength sample (3×2×40 mm) was produced, and the three-point bending strength as measured in a bending strength tester was 320 MPa.

TABLE 2

|  | Thermal Conductivity (W/mK) | | Coefficient of Thermal Expansion (ppm/K) | Density (g/cm$^3$) | Vf (vol %) |
| --- | --- | --- | --- | --- | --- |
|  | Initial | After Heat Cycles | | | |
| Example 1 | 660 | 620 | 6.1 | 3.25 | 67 |
| Example 2 | 655 | 615 | 6.3 | 3.24 | 66 |
| Example 3 | 648 | 630 | 6.3 | 3.23 | 65 |
| Comparative Example 1 | 580 | 578 | 7 | 3.2 | 62 |

Additionally, after ultrasonically cleaning the above-mentioned aluminum-diamond composites, they were pretreated with a Zn catalyst, then electroplated with Ni, electroless-plated with Ni—P, and electroplated with Au, to form plating layers having a thickness of 6 μm (Ni: 2.0 μm+Ni—P: 2.0 μm+Au: 2.0 μm) on the surfaces of the aluminum-diamond composites according to Examples 1-4. Upon measuring the solder wet-spreading rate of the resulting plated products in accordance with MS Z3197, the solder wet-spreading rate was at least 80% in all of the plated products. Additionally, upon measuring the peel strength of the plated products, all of the plated products had a peel strength of at least 10 kgf/cm. Furthermore, after subjecting the resulting plated products to heat treatments for 10 minutes at a temperature of 400° C. in an air atmosphere and observing the plated surfaces, no abnormalities such as swelling were found.

As shown in Table 2, the aluminum-diamond composites according to Examples 1-3 have a high thermal conductivity of at least 600 W/mK and a coefficient of thermal expansion close to that of semiconductor devices, and are capable of adequately dissipating heat generated from semiconductor devices. Additionally, by forming an appropriate surface metal layer on the composite surface, sufficient plating adhesion can be ensured, and the occurrence of swelling or the like in the surface metal layer portion can be suppressed even after heat resistance tests that assume actual use under a high load.

Examples 4, 5 and Comparative Examples 2-4

High-purity diamond powders C having an average roundness (Sysmex Flow Particle Image Analyzer FPIA-3000) of 0.97 when measuring 220 grains at 5-times magnification, having a first peak in the volumetric distribution at 15 μm and a second peak at 140 μm, and wherein the ratios between the area of the volumetric distribution of grain sizes of 1-35 μm and the area of the volumetric distribution of grain sizes of 45-205 μm were as shown in Table 3, were subjected to a heat treatment for 60 minutes at 700° C. in an air atmosphere to roughen their surfaces.

The grain size distribution measurement of the diamond powder C was performed by adding the diamond powder C to pure water to produce a slurry as the measurement solution, which was measured with a Beckman Coulter: Coulter LS230 using a refractive index of 1.33 for water and a refractive index of 2.42 for diamond.

A diamond powder was formed by mixing together 50 g of the surface-roughened diamond powder C, 16 g of silica powder (average grain size: 5 μm) and 16 g of silicon powder (average grain size: 10 μm), then loading the mixture into a silicon carbide crucible, and subjecting the mixture to a heat treatment for 3 hours at a temperature of 1450° C. in an argon atmosphere to form a layer of β-type silicon carbide on the diamond powder surface.

TABLE 3

| | Peak Volume Ratio | |
|---|---|---|
| | First Peak | Second Peak |
| Example 4 | 1 | 9 |
| Example 5 | 4 | 6 |
| Comparative Example 2 | 0 | 10 |
| Comparative Example 3 | 5 | 5 |

TABLE 3-continued

| | Peak Volume Ratio | |
|---|---|---|
| | First Peak | Second Peak |
| Comparative Example 4 | 10 | 0 |

Next, a 40×40×2 mmt stainless steel plate (SUS 430 material) was coated with an alumina sol and baked for 30 minutes at 350° C., after which a graphite mold release agent was applied to the surface to produce a mold release plate (reference number 9 in FIG. 2). Additionally, the diamond powders of Table 1 were loaded so as to be sandwiched between the surfaces of mold release plates 9, with pure aluminum foil having a thickness of 30 μm being disposed above and below, inside an isotropic graphite tool (reference number 8 in FIG. 2) having a porosity of 20%, having a 40×40×8 mmt cavity in the center and external dimensions of 60×60×8 mmt, thereby forming a structure.

A plurality of the above-mentioned structures were stacked, interposed by 60×60×1 mmt mold release plates (reference number 9 in FIG. 2) coated with a graphite mold release agent, and iron plates having a thickness of 12 mm were arranged on both sides thereof, and connected by six M10 bolts that were tightened using a torque wrench with a planar-direction tightening torque of 10 Nm to form a single block.

Next, the resulting block was preheated to a temperature of 650° C. in an electric furnace, then placed in a press mold having an interior size of 300 mm which was heated beforehand, and a molten aluminum alloy, containing 12 mass % of silicon and 1 mass % of magnesium, at a temperature of 800° C., was poured in and pressed for 20 minutes at a pressure of 100 MPa to impregnate the diamond powder with the aluminum alloy. After cooling to room temperature, a wet handsaw was used to cut the block along the shape of the mold release plates, and the sandwiched stainless steel plates were stripped away. Thereafter, an annealing treatment was performed for 3 hours at a temperature of 530° C. in order to eliminate strain generated during impregnation, so as to obtain an aluminum-diamond composite.

The resulting aluminum-diamond composite was polished on both surfaces with a planar grinder using a #230 diamond grinding wheel, then buffed.

Next, the aluminum-diamond composite was worked to a shape of 25×25 mm using a laser cutter under conditions of a cutting speed of 50 mm/min.

Additionally, samples for measuring the coefficient of thermal expansion (3×2×10 mmt) and samples for measuring the thermal conductivity (25×25×2 mmt) were produced by laser machining. Using the respective sample pieces, the density (by the Archimedean method) and Vf were measured, the coefficient of thermal expansion for a temperature from 25° C. to 150° C. was measured using a thermal expansion meter (Seiko Electronics TMA300), and the thermal conductivity at 25° C. was measured by the laser flash method (Rigaku LF/TCM-8510B). Additionally, the results for the thermal conductivity after 1000 air-tank heat cycles from −50° C. (held for 30 minutes) to 135° C. (held for 30 minutes) are shown in Table 4.

TABLE 4

|  | Thermal Conductivity (W/mK) | | Coefficient of Thermal Expansion (ppm/K) | Density (g/cm³) | Vf (Vol %) |
| --- | --- | --- | --- | --- | --- |
|  | Initial | After Heat Cycles | | | |
| Example 4 | 650 | 648 | 6.4 | 3.23 | 65 |
| Example 5 | 651 | 650 | 6.2 | 3.24 | 66 |
| Comparative Example 2 | 520 | 515 | 7.1 | 3.19 | 60 |
| Comparative Example 3 | 530 | 525 | 7.1 | 3.19 | 60 |
| Comparative Example 4 | 400 | 380 | 7.7 | 3.15 | 55 |

Furthermore, after ultrasonically cleaning the above-mentioned aluminum-diamond composites, aluminum layers having a thickness of 0.5 μm were formed on the surfaces of the composites by vapor deposition, and they were subjected to a heat treatment for 30 minutes at a temperature of 500° C. in a nitrogen atmosphere. Next, plating layers similar to those of Example 1 were formed on the aluminum-diamond composites having aluminum layers formed on the surfaces. Upon measuring the solder wet-spreading rate of the resulting plated products in accordance with ES Z3197, the solder wet-spreading rate was at least 80% in all of the plated products. Additionally, upon measuring the peel strength of the plated products, all of the plated products had a peel strength of at least 10 kgf/cm. Furthermore, after subjecting the resulting plated products to heat treatments for 10 minutes at a temperature of 400° C. in an air atmosphere and observing the plated surfaces, no abnormalities such as swelling were found.

The aluminum-diamond composites according to Examples 4 and 5 have a high thermal conductivity of at least 600 W/mK and a coefficient of thermal expansion close to that of semiconductor devices, and are capable of adequately dissipating heat generated from semiconductor devices. Additionally, by forming an appropriate surface metal layer on the composite surface, sufficient plating adhesion can be ensured, and the occurrence of swelling or the like in the surface metal layer portion can be suppressed even after heat resistance tests that assume actual use under a high load.

Examples 6-11 and Comparative Examples 5-8

Using diamond powders having a first peak and a second peak in the volumetric distribution, wherein the maximum values of the peaks were in the ranges shown in Table 5, and wherein, in the volumetric distributions, the ratio between the area of the volumetric distribution of grain sizes of 1-35 μm and the area of the volumetric distribution of grain sizes of 45-205 μm is 3:7, aluminum-diamond composites were produced using the same method as in Example 1 aside from the fact that a heat treatment was performed at 750° C.×30 minutes in an air atmosphere. The grain size distribution measurement of the diamond powders was performed by adding each diamond powder to pure water to produce a slurry as the measurement solution, which was measured with a Beckman Coulter: Coulter LS230 using a refractive index of 1.33 for water and a refractive index of 2.42 for diamond.

TABLE 5

|  | Peak Position (μm) | |
| --- | --- | --- |
|  | First Peak | Second Peak |
| Example 6 | 5 | 140 |
| Example 7 | 15 | 100 |
| Example 8 | 15 | 150 |
| Example 9 | 15 | 180 |
| Example 10 | 25 | 140 |
| Example 11 | 15 | 125 |
| Comparative Example 5 | 0.5 | 140 |
| Comparative Example 6 | 15 | 225 |
| Comparative Example 7 | 15 | 40 |
| Comparative Example 8 | 40 | 140 |

Samples for measuring the coefficient of thermal expansion (3×2×10 mmt) and samples for measuring the thermal conductivity (25×25×2 mmt) were produced by laser machining the resulting aluminum-diamond composites. Using the respective sample pieces, the density (by the Archimedean method) and Vf, were measured, the coefficient of thermal expansion for a temperature from 25° C. to 150° C. was measured using a thermal expansion meter (Seiko Electronics TMA300), and the thermal conductivity at 25° C. was measured by the laser flash method (Rigaku LF/TCM-8510B). Additionally, the results for the thermal conductivity after 1000 air-tank heat cycles from −50° C. (held for 30 minutes) to 135° C. (held for 30 minutes) are shown in Table 6.

TABLE 6

|  | Thermal Conductivity (W/mK) | | Coefficient of Thermal Expansion (ppm/K) | Density (g/cm³) | Vf (Vol %) |
| --- | --- | --- | --- | --- | --- |
|  | Initial | After Heat Cycles | | | |
| Example 6 | 645 | 641 | 6.4 | 3.23 | 65 |
| Example 7 | 640 | 638 | 6.3 | 3.23 | 65 |
| Example 8 | 658 | 655 | 6.2 | 3.25 | 66 |
| Example 9 | 658 | 650 | 6 | 3.25 | 67 |
| Example 10 | 662 | 660 | 6.1 | 3.25 | 67 |
| Example 11 | 654 | 652 | 6.3 | 3.24 | 66 |
| Comparative Example 5 | 510 | 505 | 7.4 | 3.18 | 59 |
| Comparative Example 6 | 500 | 490 | 7.5 | 3.17 | 58 |
| Comparative Example 7 | 505 | 500 | 7.4 | 3.17 | 58 |
| Comparative Example 8 | 515 | 513 | 7.3 | 3.18 | 59 |

Examples 12-18

Aluminum-diamond composites were produced using the same method as in Example 1, except that the diamond powder A was surface-roughened by the method shown in Table 7.

Samples for measuring the thermal conductivity (25×25×2 mmt) were produced by laser machining the resulting aluminum-diamond composite, and the thermal conductivity at 25° C. was measured by the laser flash method (Rigaku LF/TCM-8510B). Additionally, the results for the thermal conductivity after 1000 heat cycles from −50° C. to 135° C. are shown in Table 8.

TABLE 7

| | Heat Treatment | |
|---|---|---|
| | Treatment | Time(min.) |
| Example 12 | 600° C. | 180 |
| Example 13 | 600° C. | 30 |
| Example 14 | 750° C. | 60 |
| Example 15 | 800° C. | 60 |
| Example 16 | 800° C. | 30 |
| Example 17 | 900° C. | 180 |
| Example 18 | 900° C. | 30 |

TABLE 8

| | Thermal Conductivity (W/mK) | |
|---|---|---|
| | Initial | After Heat Cycles |
| Example 12 | 656 | 653 |
| Example 13 | 661 | 650 |
| Example 14 | 660 | 657 |
| Example 15 | 655 | 648 |
| Example 16 | 658 | 652 |
| Example 17 | 653 | 650 |
| Example 18 | 656 | 653 |

The aluminum-diamond composites according to Examples 6-18 have a high thermal conductivity of at least 600 W/mK and have a coefficient of thermal expansion close to that of semiconductor devices, and are capable of adequately dissipating heat generated from semiconductor devices. Additionally, due to having a high thermal conductivity and a coefficient of thermal expansion close to that of semiconductor devices, and forming an appropriate surface metal layer on the composite surface, adequate plating adhesion can be ensured, and swelling of the surface metal portion or the like can be suppressed even after heat resistance tests that assume actual use under a high load. Furthermore, with Examples 4-18, decreases in thermal conductivity due to heat cycling were able to be suppressed, and improved reliability was obtained.

DESCRIPTION OF THE REFERENCE NUMBERS 1 aluminum-diamond composite
2 surface metal layer
3 composited portion
4 surface layer
5 Ni layer
6 Ni alloy layer
7 Au layer
8 mold member consisting of porous body
9 mold release plate coated with mold release agent
10 diamond powder
11 metal plate

The invention claimed is:

1. An aluminum-diamond composite comprising: 65-80 vol % of a diamond powder having a roundness of at least 0.94 and a roughened surface, for which a first peak in a volumetric distribution of grain size lies at 5-25 μm, and a second peak lies at 55-195 μm, and a ratio between the area of a volumetric distribution of grain sizes of 1-35 μm and the area of a volumetric distribution of grain sizes of 45-205 μm is from 1:9 to 4:6; the balance being composed of a metal containing aluminum.

2. The aluminum-diamond composite in accordance with claim 1, wherein the diamond powder is one that has been heat-treated, in an air atmosphere, at a temperature of at least 600° C. and at most 900° C., for at least 30 minutes and at most 180 minutes.

3. A heat-dissipating component comprising the aluminum-diamond composite in accordance with claim 1, formed in the shape of a flat plate, wherein both surfaces of the aluminum-diamond composite are covered with a surface layer comprising at least 80 vol % of a metal containing aluminum and having a film thickness of 0.03-0.2 mm.

4. The heat-dissipating component in accordance with claim 3, wherein
both surfaces have, in sequence from the aluminum-diamond composite-side,
an Ni layer having a film thickness of 0.5-6.5 μm,
an amorphous Ni alloy layer having a film thickness of 0.5-6.5 μm, and
a metal layer consisting of an Au layer having a film thickness of at least 0.05 μm,
such that the sum of the film thicknesses of the Ni layer and the Ni alloy layer is 1.0-10 μm.

5. The heat-dissipating component in accordance with claim 3, wherein the thickness of the aluminum-diamond composite is 0.4-6 mm.

* * * * *